United States Patent [19]
Ebinuma et al.

[11] Patent Number: 5,150,391
[45] Date of Patent: Sep. 22, 1992

[54] EXPOSURE APPARATUS

[75] Inventors: Ryuichi Ebinuma, Kawasaki; Nobutoshi Mizusawa, Yamato; Takao Kariya, Hino; Shigeyuki Suda, Yokohama; Shunichi Uzawa, Tokyo, all of Japan

[73] Assignee: Canon Kabushiki Kaisha, Tokyo, Japan

[21] Appl. No.: 830,449

[22] Filed: Feb. 5, 1992

Related U.S. Application Data

[63] Continuation of Ser. No. 662,346, Feb. 28, 1991, abandoned.

[30] Foreign Application Priority Data

Mar. 2, 1990 [JP] Japan ................... 2-049583

[51] Int. Cl.⁵ .............................................. G21K 5/04
[52] U.S. Cl. .................... 378/34; 378/145; 378/152; 250/492.2
[58] Field of Search ............... 378/34, 35, 145, 147, 378/150–152; 250/492.1, 492.2, 492.3, 505.1; 355/53, 54, 71

[56] References Cited

U.S. PATENT DOCUMENTS

| | | | |
|---|---|---|---|
| 4,825,453 | 4/1989 | Kembo | 378/34 |
| 4,856,037 | 8/1989 | Mueller et al. | |
| 4,875,076 | 10/1989 | Torigoe et al. | |
| 4,916,322 | 4/1990 | Glauigh et al. | 378/34 |
| 4,999,506 | 3/1991 | Mizusawa et al. | |

FOREIGN PATENT DOCUMENTS

| | | |
|---|---|---|
| 136672 | 4/1985 | European Pat. Off. |
| 253283 | 1/1988 | European Pat. Off. |
| 336537 | 10/1989 | European Pat. Off. |
| 358521 | 3/1990 | European Pat. Off. |
| 419240 | 3/1991 | European Pat. Off. |
| 1243519 | 9/1989 | Japan |

Primary Examiner—David P. Porta
Attorney, Agent, or Firm—Fitzpatrick, Cella, Harper & Scinto

[57] ABSTRACT

An exposure apparatus for transferring a pattern of an original onto a workpiece, includes a blocking member for defining a rectangular exposure region with respect to at least one of the original and the workpiece, wherein the exposure for the pattern transfer can be effected with the exposure region defined by the blocking member. Plural detection systems detect a positional deviation between the original and the workpiece, each of which is disposed so as to be associated with at least one of four sides of the rectangular exposure region. Plural first movable stages each is provided so as to be associated with at least one of the four sides, and each is adapted to carry thereon one of the detection systems disposed to be associated with a corresponding side. Each first movable stage comprises a single-axis stage movable in a direction parallel to a corresponding side. Plural second stages each carryies thereon corresponding one of the first movable stages, and each comprises a single-axis stage movable in a direction perpendicular to a corresponding side and in a direction parallel to the rectangular exposure region. Each second movable state is operable to displace the light blocking member to change the rectangular exposure region.

5 Claims, 4 Drawing Sheets

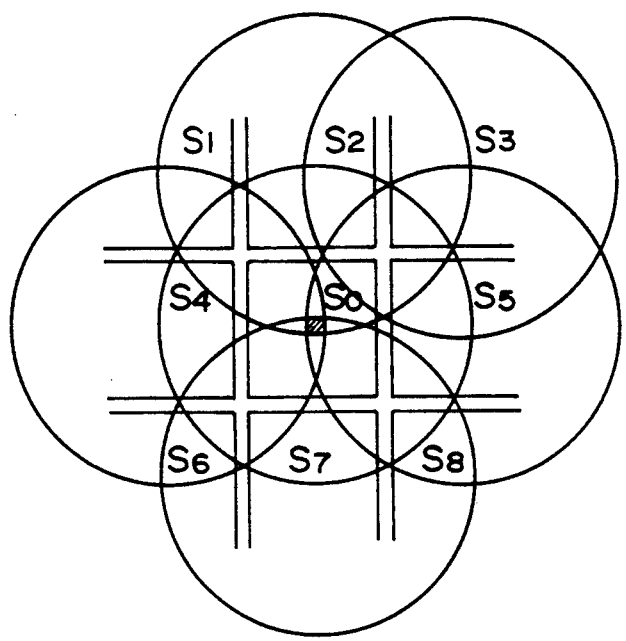
F I G. 1A
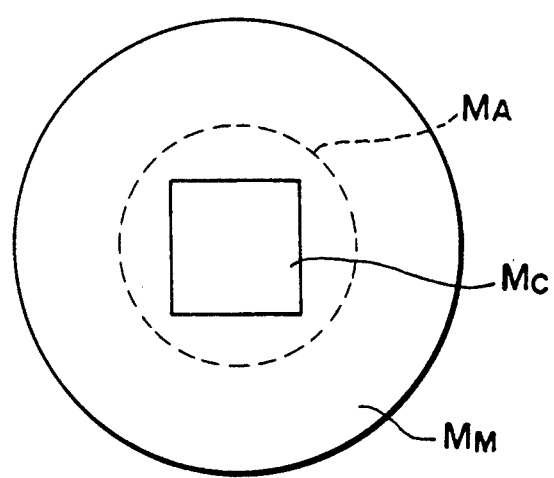
F I G. 1B

EXPOSURE APPARATUS

This application is a continuation of application Ser. No. 07/622,346, filed on Feb. 28, 1991, now abandoned.

FIELD OF THE INVENTION AND RELATED ART

This invention relates to an exposure apparatus and, more particularly, to an exposure apparatus for transferring and printing an image of an original, such as a mask, onto a workpiece such as a semiconductor wafer, with high precision.

With recent increasing degree of integration of semiconductor integrated circuit, in an exposure apparatus (aligner) for manufacture of the same, further enhancement of transfer precision is required. As an example, for an integrated circuit of 256 megabit DRAM, an exposure apparatus capable of printing a pattern of a linewidth of 0.25 micron order is necessary.

As such super-fine pattern printing exposure apparatus, a proximity exposure apparatus which uses orbit radiation light (SOR X-rays) has been proposed.

The orbit radiation light has a sheet beam shape, uniform in a horizontal direction. Thus, for exposure of a plane of certain area, many proposals have been made, such as follows:

(1) Scan exposure method wherein a mask and a wafer are moved in a vertical direction whereby the surface is scanned with X-rays of sheet beam shape in a horizontal direction;

(2) Scan mirror exposure method wherein X-rays of sheet beam shape are reflected by an oscillating mirror whereby a mask and a wafer are scanned in a vertical direction; and (3) Simultaneous exposure method wherein X-rays of sheet beam shape in a horizontal direction are diverged in a vertical direction by an X-ray mirror having a reflection surface machined into a convex shape, whereby an exposure region as a whole is irradiated simultaneously.

The inventors of the subject application have cooperated to devise such a simultaneous exposure type X-ray exposure apparatus, which is disclosed in Japanese Laid-Open Patent Application No. 243519/1989.

An X-ray exposure apparatus involves the following problems. Ultraviolet rays can be blocked substantially completely by a ultraviolet-ray reflective thin film such as a chromium film. For this reason, in conventional exposure apparatuses that use ultraviolet rays or the like as an exposure light, only by covering a region on the mask surface outside the exposure region with a patterning material such as chromium in a similar manner as the blocking portion of a pattern formed in the exposure region, it is possible to prevent exposure of a non-desired region on a wafer. In an X-ray exposure apparatus, however, an absorptive material such as gold, chromium or the like used as an X-ray blocking portion of a mask pattern in the exposure region can not have a sufficient thickness in the case of a linewidth of 0.25 micron, and for this reason a small amount of X-rays are transmitted therethrough. In practical examples, the transmission factor of this portion reaches several percentages. As a result, only by covering a region on the mask surface outside the exposure region with a patterning material such as gold, chromium or the like in the same manner as the X-ray blocking portion of the mask pattern in the exposure region, the protection is insufficient and such portion of the wafer, not desired to be exposed, is exposed with the X-rays. For example, it is now assumed that, by using a mask such as shown in FIG. 1B, different portions (show areas) S0-S8 of a wafer such as shown in FIG. 1A are going to be exposed. The mask shown in FIG. 1B has an exposure region MC in which a circuit pattern (not shown) is formed. Denoted at MM is a pattern, outside the exposure region, covering this portion with an absorptive material such as gold, chromium or the like having a similar thickness as of an X-ray blocking portion of the circuit pattern MC region. Inside a broken line MA corresponds to a region to be irradiated with X-rays. In this example, in the wafer shown in FIG. 1A, the shot area S0 is exposed to X-rays passing through the non-exposure region pattern MM of the mask shown in FIG. 1B, during exposures of the surrounding shot areas S1–S8. Inside area of each circle shown in FIG. 1A corresponds to the region to be exposed to the X-rays passed through the non-exposure region pattern MM, during exposure of each shot area. As an example, the central hatched portion of the shot area S0 in FIG. 1A is subjected to four undesirable exposures during the exposures of the surrounding shot areas S2, S4, S5 and S7. If the quantity of irradiation (exposure) in the exposure region becomes non-uniform such as above, the transfer precision is deteriorated.

A solution for such a problem may be enlargement of the film thickness at the non-exposure region pattern MM of gold, chromium or the like, to be patterned on a mask. However, possible non-uniformness in thickness causes a stress which, in turn, produces distortion. As a result, the precision in size of the pattern in the exposure region is deteriorated.

On the other hand, an exposure apparatus has been proposed wherein four sides are enclosed by blocking members, separate from a mask pattern, to define an aperture through which the exposure light is projected, whereby only the exposure region on a mask is irradiated. Each blocking member defining this aperture can have a sufficient thickness and, therefore, if such an aperture is applied to an X-ray exposure apparatus, it is possible to reduce the X-ray irradiation to the non-exposure region to a small degree that can be neglected.

Also, an exposure apparatus with such an aperture is known wherein a light blocking member and an alignment optical system for detecting the relative position of a mask and a wafer are mounted on a dual-axis stage, by which they can be moved in a plane parallel to the mask or wafer surface and in X and Y directions. This structure makes it possible to set the blocking member and the alignment optical system at a desired position and, therefore, it can meet various sizes of a shot area (or semiconductor chip). Further, by commonly using a stage for the movement of the blocking member and for the movement of the alignment optical system, the structure of the device can be simplified and reduced in weight.

SUMMARY OF THE INVENTION

The present invention in an aspect pertains to an exposure apparatus with a rectangular aperture defined by enclosing four sides with light blocking members, and it is a primary object of the present invention to provide an exposure apparatus wherein there is no necessity of using a stage exclusive for the aperture and wherein each light blocking member is immovable in a lateral direction (parallel to a corresponding side of the aperture), such that the size of each light blocking member can be made small.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are schematic views respectively, for explaining the states of exposures where the exposure region is limited by a mask pattern.

DESCRIPTION OF THE PREFERRED EMBODIMENTS

Figure 2:
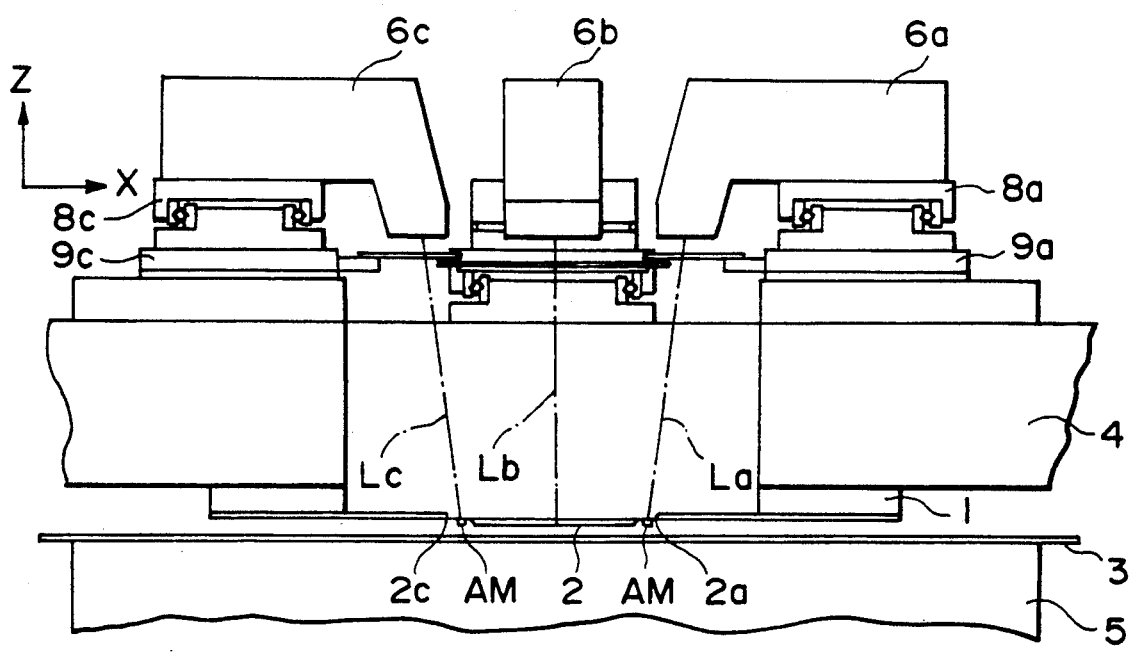
FIGS. 2 and 3 are a sectional view and a plan view, respectively, showing the structure of a portion, around an aperture, of an X-ray aligner according to an embodiment of the present invention.
Figure 3:
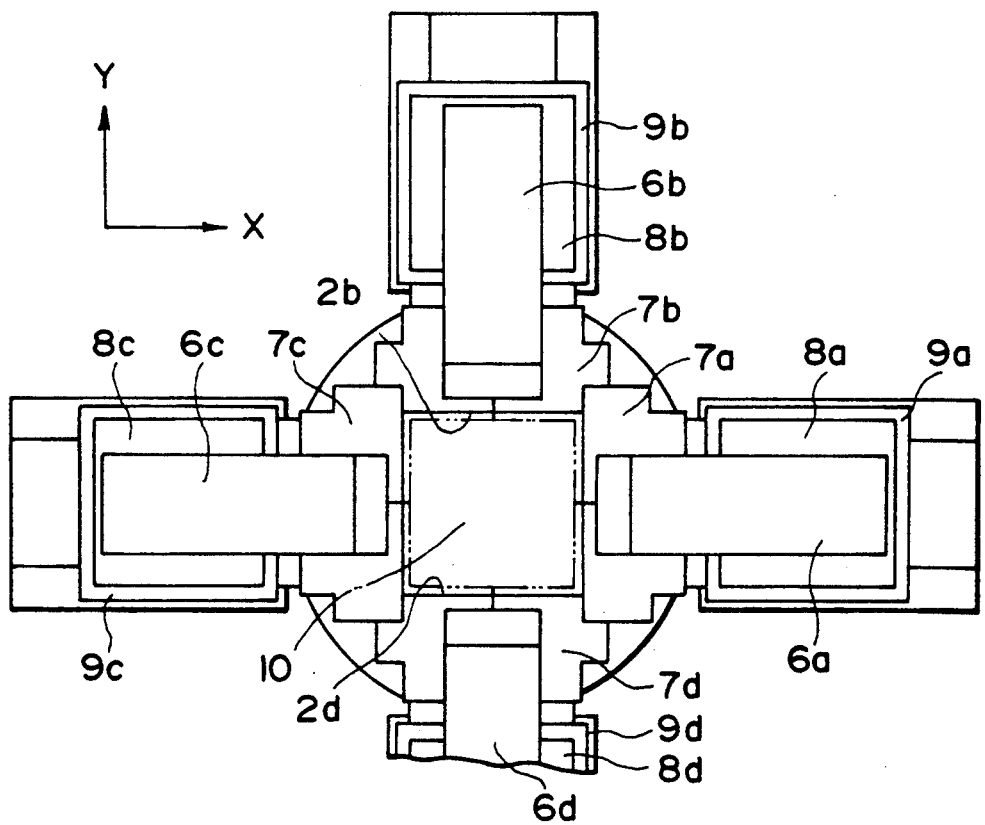

FIGS. 2 and 3 are a sectional view and a plan view, showing the structure of a portion around an aperture in an X-ray aligner according to a fourth embodiment of the present invention. Denoted in the drawings at 1 is a mask having a circuit pattern (exposure region) 2 to be transferred; at 3 is a wafer onto which the circuit pattern of the mask is to be transferred; at 4 is a base on which the mask is held fixed; at 5 is a wafer chuck with which the wafer is held fixed on a wafer stage (not shown); at 6a-6d are pickups each comprising a semiconductor laser for projecting light onto alignment marks AM formed on the mask and the wafer, a CCD line sensor for detecting diffraction light or the like from the alignment marks, which contains positional deviation information and the like; and at La-Ld are paths for the alignment lights.

In this X-ray aligner as the wafer 3 is brought to the exposure position, a positional deviation between the mask 1 and the wafer 3 with reference to a predetermined standard positional relationship is detected on the basis of the outputs from the pickups 6a-6d. Then, on the basis of results of positional deviation detection, the wafer stage is driven to correct a positional deviation (gap, parallelism and the like) of the mask 1 and the wafer 3 in the Z-axis direction as well as a positional deviation of them in respect to the X, Y and θ directions. After such positional deviation correction, exposure light such as X-rays emitted from a SOR (synchrotron orbit radiation) source, for example, is projected from the above to the below in the Z direction in FIG. 2, namely, in a direction perpendicular to the sheet of the drawing of FIG. 11, whereby an image of the pattern of the mask is printed on the wafer.

Denoted at 7a-7d are light blocking plates for defining the exposure region 2. Each of these light blocking plates 7a-7d is made of a material having a sufficient thickness such that, while the laser light projected from the pickup can path therethrough, almost all the X-rays (exposure light) are blocked thereby. Usable examples are X-ray resistive glasss such as BK-7R available from OHARA Inc. Japan and BK-7G25 available from JENAer GLASWERK SCHOTT & GEN. Denoted at 8a-8d are first stages for carrying thereon the pickups 6a-6d, respectively, each of which comprises a single-axis stage movable in a plane parallel to the exposure plane (X—Y plane) and in a direction parallel to corresponding one of the sides 2a-2d of the exposure region 2. The first movable stages 8a and 8c are movable in the Y direction, while the first movable stages 8b and 8d are movable in the X direction. Denoted at 9a-9d are second movable stages for carrying thereon the first movable stages 8a-8d, respectively, each of which comprises a single-axis stage movable in a plane parallel to the X—Y plane and in a direction perpendicular to corresponding one of the sides 2a-2d of the exposure region 2. The second movable stages 9a-9c are movable in the X direction, while the second movable stages 9b and 9d are movable in the Y direction. The first movable stage 8a and the second movable stage 9a cooperate and constitute a dual-axis stage for moving the pickup 6a in the X and Y directions. Similarly, the pair of single-axis stages 8b and 9b, the pair of the single-axis stages 8c and 9c and the pair of single-axis stages 8d and 9d, provide dual-axis stages, respectively, for moving the pickups 6b, 6c and 6d, respectively.

The light blocking plates 7a-7d are mounted on the second movable stages 9a-9d, respectively, and they are set at those positions defining the aperture 10 corresponding to the exposure region 2, prior to the X-ray exposure. Alignment marks are formed at such positions that, when the blocking plates 7a-7d are aligned with respect to the exposure region 2, the alignment marks can be detected by the pickups 6a-6d, respectively.

Figure 4:
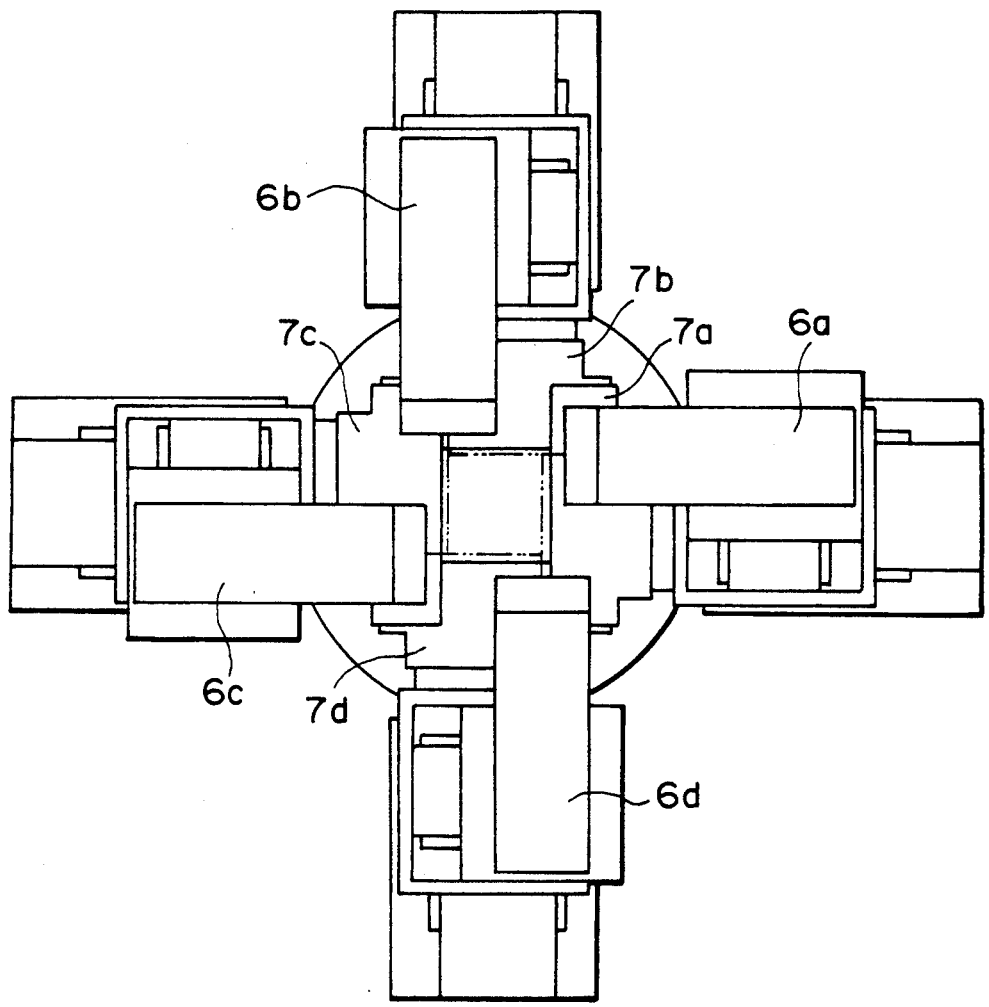
FIG. 4 is a plan view, showing an example wherein the exposure region in FIG. 3 is small and each alignment mark is formed at an end portion of a corresponding side of the exposure region.

In this X-ray aligner, each dual-axis stage for moving corresponding one of the pickups 6a-6d, is provided by a combination of corresponding one of the single-axis stages 8a-8d each being movable in a direction (lateral direction) parallel to corresponding one of the four sides 2a-2d of the exposure region 2, with corresponding one of the single-axis stages 9a-9d each being movable in a direction (longitudinal direction) perpendicular to the corresponding one of the sides 2a-2d of the exposure region 2. Each of the single-axis stages 8a-8d is mounted on corresponding one of the single-axis stages 9a-9d, with the moving direction of each of the single-axis stages 9a-9d being confined only to the longitudinal direction. Additionally, the light blocking plates 7a-7d for defining the exposure region are mounted on the single-axis stages 9a-9d, respectively. In this manner, the stages for moving the pickups 6a-6d, respectively, are used also as the stages for moving the light blocking plates 7a-7d, respectively. This makes it possible to eliminate the necessity of using specific stage means exclusively for changing the aperture size. Also, the light blocking plates 7a-7d are mounted on the stages 9a-9d each being movable only in the longitudinal direction. This avoids the necessity of moving the stages 9a-9d and the blocking plates 9a-9d in their lateral directions even in such occasion where, as shown in FIG. 4, each alignment mark is formed at an end portion of corresponding one of the sides 2a-2d of the exposure region 2 and thus the pickups 6a-6d have to be moved laterally to the end portions. Therefore, as compared with a structure wherein each light blocking plate moves laterally, the aperture device comprising the light blocking plates 7a-7d and the like can be made compact.

Further, by using, as the light blocking plates 7a-7d, such a material effective to block X-rays for the exposure but effective to transmit alignment laser light, it is possible to dispose the aperture member (blocking plates 7a–7d) between the mask 1 and the pickups 6a–6d since the alignment light can pass through the light blocking plate. By disposing the aperture member close to the mask 1, as above, it is possible to prevent deterioration of the precision of controlling the exposure region limitation attributable to a change in the angle of incidence of the exposure X-rays or diffraction at the edges of the light blocking plates 7a–7d.

Further, when the exposure X-rays are projected, the light blocking plates 7a–7d can serve to prevent impingement of scattered X-rays from the mask 1 upon the pickups 6a–6d. Therefore, it is possible to protect the alignment system against the scattered X-rays. As a matter of course, each light blocking plate has a sufficient size so as to prevent impingement of the scattered X-rays from the mask 1 upon the pickup.

As described hereinbefore, an important feature of this embodiment resides in that the light blocking member for blocking the illumination light for the exposure, itself, dose allow passage of the illumination light for the positional deviation detection. Where the illumination light for the exposure comprises X-rays and the illumination light for the positional deviation detection comprises light such as a laser light, for example, having a wavelength longer than near-ultraviolet light, the light blocking member may be made of a material such as light transmissive ceramics such as PLZT or MgO, $Y_2O_3$, $Gd_2O_3$, etc.

Figure 5:
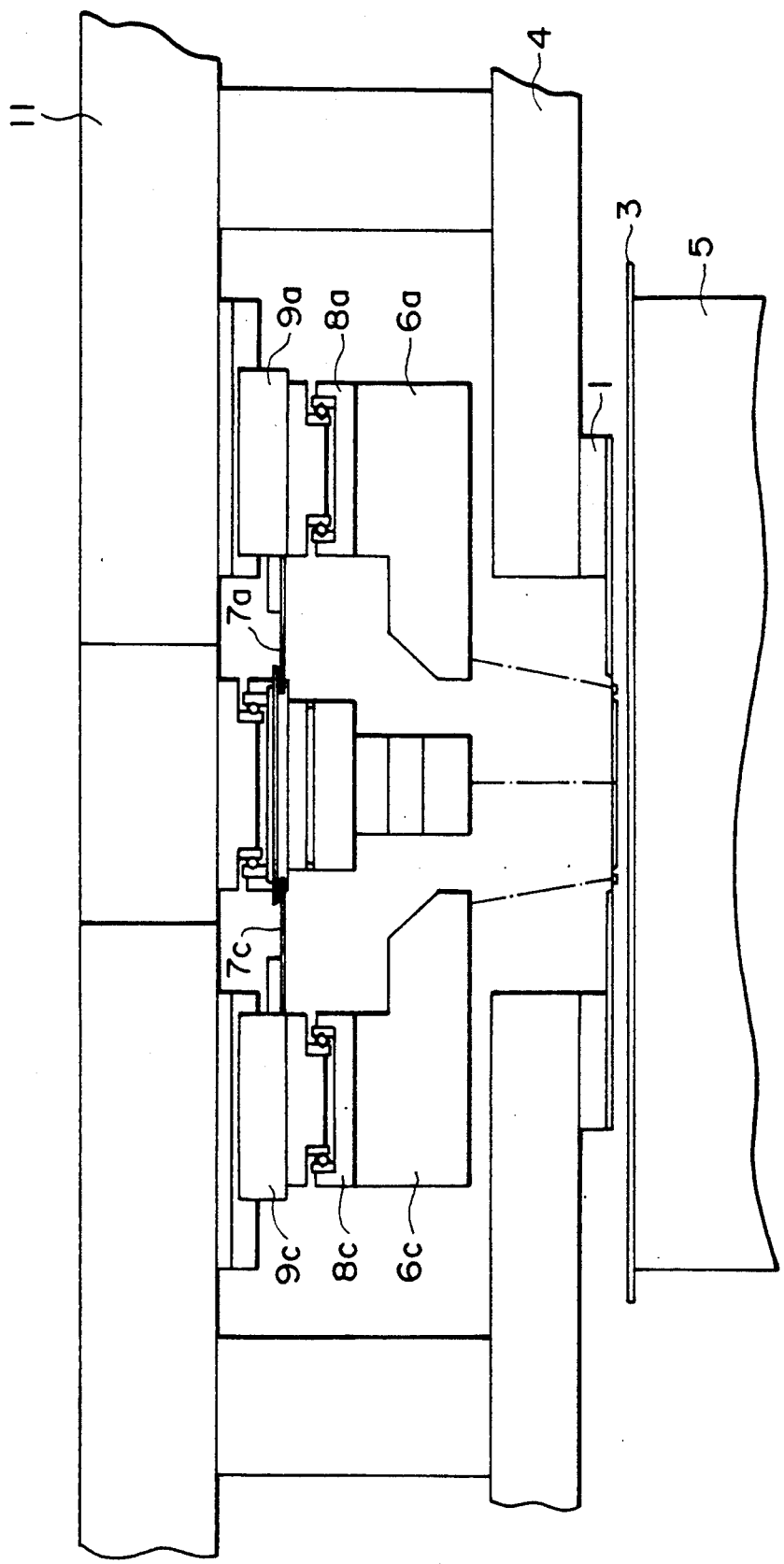
FIG. 5 is a sectional view showing the structure of a portion, around an aperture, of an X-ray aligner according to another embodiment of the present invention.

FIG. 5 shows the structure of a portion, around an aperture, of an X-ray aligner according to another embodiment of the present invention. As compared with the FIG. 2 embodiment, in the X-ray aligner of this embodiment the position of the light blocking plates 7a–7d and the pickups 6a–6d with respect to the mask 1 and the wafer 3, are interchanged. In the aligner of FIG. 5, the light blocking plates 7a–7d do not block the alignment light paths La–Ld and, therefore, higher freedom is attainable with regard to the material of the light blocking plates 7a–7d, as compared with the FIG. 2 aligner. In FIG. 5, reference numeral 11 denotes a base of the alignment optical system.

While in the foregoing description the invention has been explained with reference to examples wherein the invention is applied to an X-ray exposure apparatus, the invention is applicable also to a case wherein ultraviolet light or the like is used as the exposure illumination light.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for transferring a pattern of an original onto a workpiece, said apparatus comprising:
    a blocking member for defining a rectangular exposure region with respect to at least one of the original and the workpiece, wherein the exposure for the pattern transfer can be effected with the exposure region defined by said blocking member;
    a plurality of detection systems for detecting a positional deviation between the original and the workpiece, each of said detection systems is disposed so as to be associated with at least one of four sides of the rectangular exposure region;
    a plurality of first movable stages each being provided so as to be associated with at least one of the four sides, each of said first movable stages being adapted to carry thereon one of said detection systems disposed to be associated with a corresponding side, and each of said first movable stages comprises a single-axis stage movable in a direction parallel to a corresponding side; and
    a plurality of second movable stages each for carrying thereon corresponding one of said first movable stages, each of said second movable stages comprising a single-axis stage movable in a direction perpendicular to a corresponding side and in a direction parallel to the rectangular exposure region, and each of said second movable stages being operable to displace said light blocking member to change the rectangular exposure region.

2. An apparatus according to claim 1, wherein each of said detection systems projects light to at least one of the original and the workpiece, and receives light reflected therefrom to detect the positional deviation.

3. An apparatus according to claim 2, wherein said light blocking member has a portion effective to block illumination light for the pattern transfer but to transmit light to be used for the detection of positional deviation by said detecting systems.

4. An apparatus according to claim 1, wherein said blocking member has a size sufficient for preventing impingement of scattered light, from the original, during the exposure, upon said detection systems.

5. An apparatus according to claim 1, wherein said detection systems, said first stages and said second stages are provided so as to be associated with the four sides, respectively.

* * * * *

UNITED STATES PATENT AND TRADEMARK OFFICE
CERTIFICATE OF CORRECTION

PATENT NO. : 5,150,391
DATED : September 22, 1992
INVENTOR(S) : RYUICHI EBINUMA, ET AL.

It is certified that error appears in the above-identified patent and that said Letters Patent is hereby corrected as shown below:

On the title page:
 [57] ABSTRACT

Line 17, "carryies" should read --carries--.
 Line 22, "state" should read --stage--.

COLUMN 4

Line 48, "6a-6d" should read --6a-6d,--.
 Line 49, ", respectively," should read --respectively,--.
 Line 56, "blocking plates 9a-9d" should read --blocking plates 7a-7d--.

COLUMN 5

Line 21, "dose" should read --does--.

Signed and Sealed this

Twenty-sixth Day of October, 1993

Attest:

BRUCE LEHMAN

Attesting Officer

Commissioner of Patents and Trademarks